United States Patent [19]
Koyasu et al.

[11] Patent Number: 5,554,881
[45] Date of Patent: Sep. 10, 1996

[54] CONSTITUTION OF AN ELECTRODE ARRANGEMENT IN A SEMICONDUCTOR ELEMENT

[75] Inventors: Takahisa Koyasu, Chita; Kouji Numazaki; Hirokazu Kasuya, both of Aichi; Mitsuhiro Saitou, Obu; Kazuhisa Ikeda, Chiryu, all of Japan

[73] Assignee: Nippondenso Co., Ltd., Kariya, Japan

[21] Appl. No.: 357,492

[22] Filed: Dec. 15, 1994

[30] Foreign Application Priority Data

Dec. 17, 1993 [JP] Japan .................................. 5-317887

[51] Int. Cl.⁶ .................................................. H01L 29/70
[52] U.S. Cl. ......................... 257/584; 257/734; 257/786
[58] Field of Search ................................... 257/786, 734, 257/584, 577

[56] References Cited

U.S. PATENT DOCUMENTS

| | | | |
|---|---|---|---|
| 5,109,270 | 4/1992 | Nambu et al. | 257/786 |
| 5,317,173 | 5/1994 | Sovero | 257/197 |

FOREIGN PATENT DOCUMENTS

| | | |
|---|---|---|
| 0357410 | 9/1988 | European Pat. Off. . |
| 0393584 | 10/1990 | European Pat. Off. . |
| 266968 | 3/1990 | Japan . |

Primary Examiner—William Mintel
Assistant Examiner—Roy Potter
Attorney, Agent, or Firm—Cushman, Darby & Cushman

[57] ABSTRACT

At least four electrodes are provided on the same surface of a discrete transistor. Among these electrodes, one electrode is set as a base electrode, an electrode neighboring the base electrode in the up-and-down direction is set as an emitter electrode and an electrode neighboring the base electrode in the right-and-left direction is set as a collector electrode. On the same surface, a base electrode is provided at a position which is neither in the up-and-down direction nor in the right-and-left direction with respect to the base electrode. When the discrete transistor having this type of electrode arrangement is mounted on a substrate, one of the base electrodes formed on the substrate is connected to a first wiring, the collector electrode is connected to a second wiring, and the emitter electrode is connected to a third wiring.

17 Claims, 12 Drawing Sheets

CONSTITUTION OF AN ELECTRODE ARRANGEMENT IN A SEMICONDUCTOR ELEMENT

BACKGROUND OF THE INVENTION

1. Field of the Invention

The present invention relates to an electrode arrangement in a semiconductor element and, more particularly, to a surface mounted semiconductor device having a particular arrangement of electrodes for use in a hybrid integrated circuit or similar circuits.

2. Description of the Related Art

A conventional semiconductor device such as a hybrid integrated circuit having a discrete transistor 7 mounted as a surface of element on a substrate is shown, for example, in FIG. 17.

A discrete transistor of this type generally has, three to four protrusions (usually called bumps) formed of solder or the like on one which serve as electrodes. In one electrode configuration, four electrodes are provided for assembly stability. In this situation, an additional collector electrode 9 may be added to a three-bump discrete transistor (not shown) which has a collector electrode 8, a base electrode 10 and an emitter electrode 11. This additional collector electrode 9 works only to stabilize the mounting of the element, and is provided as the simplest way of fabricating the element.

That is, in a process for producing elements, the impurity-diffused region where the collector will be formed occupies as much diffusion area as possible on the surface of the element compared with other diffusion regions from the standpoint of dealing with a large electric current. Therefore, there has been proposed a configuration in which another collector electrode 9 is formed on an effective area in the impurity-diffused region of the collector to obtain a total of four electrodes, without requiring a change of the pattern on the element surface and contributing to improving efficiency. Therefore, this configuration has heretofore been employed as the simplest method in the step of producing elements.

Then, the discrete transistor 7, with a surface on which the electrodes are formed as a mounting surface, is mounted on a substrate 12 to form a hybrid integrated circuit as shown in FIG. 18.

Referring to the wiring on the substrate 12, when the wiring 10a to the base electrode 10 and the wiring 11a to the emitter electrode 11 are formed in the same direction, the wiring 10a must make a detour depending upon the configuration of the circuit, as described below. That is, the wiring must contain a jumper (not shown) like a lead or a 0-Ω chip resistor in the wiring 10a or 11a, or be formed by an upper conductor 15 on a lower conductor 13 insulated by an insulating glass 14.

The wiring in this case is determined by the positional relationship between the base electrode 10 and the emitter electrode 11. The jumper or the cross conductor is not needed when the wiring 11a is formed on the other side of the wiring 10a.

In the above-mentioned conventional semiconductor device, multi-layer wiring such as a jumper or a cross conductor is provided for the base line or for the emitter line when a semiconductor element having two collector electrodes, one base electrode and one emitter electrode that are suitably arranged, is mounted on a predetermined substrate and, particularly, when the wiring of the emitter electrode is formed as a wiring pattern on the substrate in the same direction as the wiring of the base electrode. Therefore, reliability is lost due to poor contact between the jumper and the occurrence of leakage in the multi-layer wiring, and the manufacturing cost is increased due to an increase in the number of parts and in the number of layers.

SUMMARY OF THE INVENTION

The present invention was accomplished in view of the above-mentioned problems, and its object is to provide a semiconductor device which enables the wiring to the semiconductor element to be formed from any direction without using multi-layer wiring such as a jumper or a cross conductor.

In order to accomplish the above-mentioned object according to the present invention there is provided a semiconductor device comprising a semiconductor element which has a plurality of electrodes formed on the same surface thereof and in which a plurality of wiring members are connected from the external side to the electrodes of the semiconductor element.

The electrodes include at least two first electrodes, and a second electrode and a third electrode of different kinds which are separate from the first electrodes. A first wiring member is selectively connected to either one of the two first electrodes, and second and third wiring members are connected to the second and third electrodes, respectively.

The electrodes of the semiconductor element are arranged in a manner that two electrodes are set at desired positions as the first electrodes, the electrode in either one of the two regions divided by a straight line passing through the two first electrodes is set as either the second electrode or the third electrode, and the electrode in the other region is set as the other one of the second and third electrodes.

The first, second and third electrodes may be set at least along the end surfaces of the semiconductor element.

The semiconductor element may be secured on the substrate, and the wiring members may comprise conductors formed on the surface of the substrate.

After the first, second and third electrodes are set, the remaining electrode may be set as an arbitrary electrode.

The wiring members consist of wires.

The semiconductor element may comprise a discrete transistor of which the surface on which the electrodes are formed serves as the mounting surface, the base electrode of the discrete transistor corresponding to the first electrodes, and the emitter electrode and the collector electrode thereof corresponding to either the second electrode or the third electrode, respectively.

The semiconductor element may comprise a MOS transistor, the gate electrode of the MOS transistor corresponding to the first electrodes, and the source electrode or the drain electrode thereof corresponding to either the second electrode or the third electrode.

The semiconductor element may be one which is so constituted as to output a signal in response to the action of mechanical energy from the external side, and the electrodes include at least an electrode for feeding electric power, an electrode for outputting signals and a plurality of electrodes for grounding. The electrodes for grounding corresponding to the first electrodes, and the electrode for feeding electric power and the electrode for outputting signals corresponding to either the second electrode or the third electrode.

The electrodes may be connected by wires to transmit and receive electric signals.

In another embodiment, a semiconductor device comprises a semiconductor element having a plurality of electrodes formed on the same surface thereof which is mounted on a substrate and in which a plurality of wiring members are directly connected from the side of the substrate to the electrodes of the semiconductor element.

The electrodes include at least two first electrodes, and a second electrode and a third electrode of different kinds which are separate from the first electrodes. A first wiring member are selectively connected to either one of the two first electrodes, and second and third wiring members are connected to the second and third electrodes, respectively.

The electrodes on the surface of the semiconductor element are arranged in a manner that the two electrodes are set at desired positions as the first electrodes, the electrode in either one of the two regions divided by a straight line passing through the two first electrodes is set as either the second electrode or the third electrode, and the electrode in the other region is set as the other one of the second and third electrodes.

The first, second and third electrodes may be set at least along the end surfaces of the semiconductor element.

The wiring members may comprise conductors formed on the surface of the substrate or wires.

The semiconductor element may comprise a discrete transistor of which the surface on which the electrodes are formed serves as the mounting surface, the base electrode of the discrete transistor corresponding to the first electrodes, and the emitter electrode and the collector electrode thereof corresponding to either the second electrode or the third electrode.

The semiconductor element may comprise a MOS transistor, the gate electrode of the MOS transistor corresponding to the first electrodes, and the source electrode and the drain electrode thereof corresponding to either the second electrode or the third electrode.

The semiconductor element may be constructed to output a signal in response to an application mechanical energy. The electrodes may include at least an electrode for feeding electric power, an electrode for outputting signals and a plurality of ground. The ground electrodes may correspond to the first electrodes, and the electrode for feeding electric power and the electrode for outputting signals may correspond to either the second electrode or the third electrode.

The electrodes may be connected by wires to transmit and receive electric signals.

In any of the above-described circuits the second wiring member may be connected to the second electrode, the third wiring member may be connected to the third electrode, and the first wiring member may be selectively connected to either one of the first electrodes in connecting a plurality of wiring members from the external side to the semiconductor element that has first, second and third electrodes of different kinds on the same surface. In this case, the present invention offers such an excellent effect that the wiring members can be reliably connected to the electrodes of the semiconductor element from any direction without the need of using multi-layer wiring such as a jumper or a cross conductor.

DESCRIPTION OF THE PREFERRED EMBODIMENTS

First Embodiment

An embodiment of the present invention will now be described in conjunction with the drawings.

Figure 1:
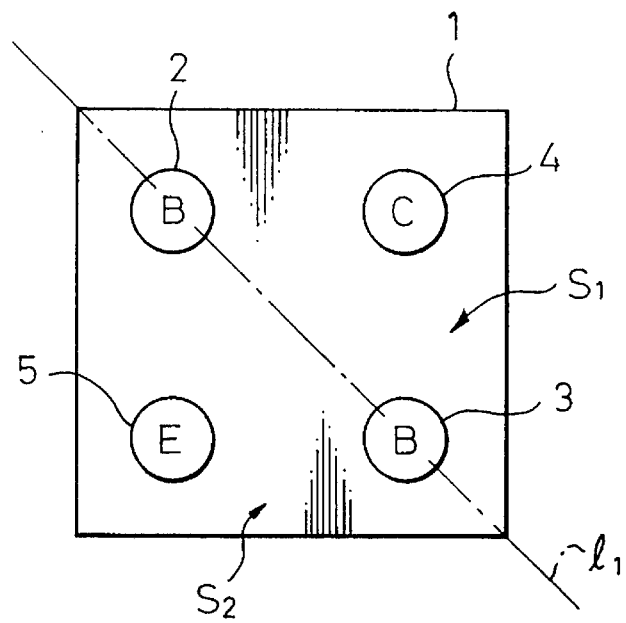
FIG. 1 is a plan view illustrating the arrangement of electrodes of a discrete transistor according to the present invention.
Figure 2:
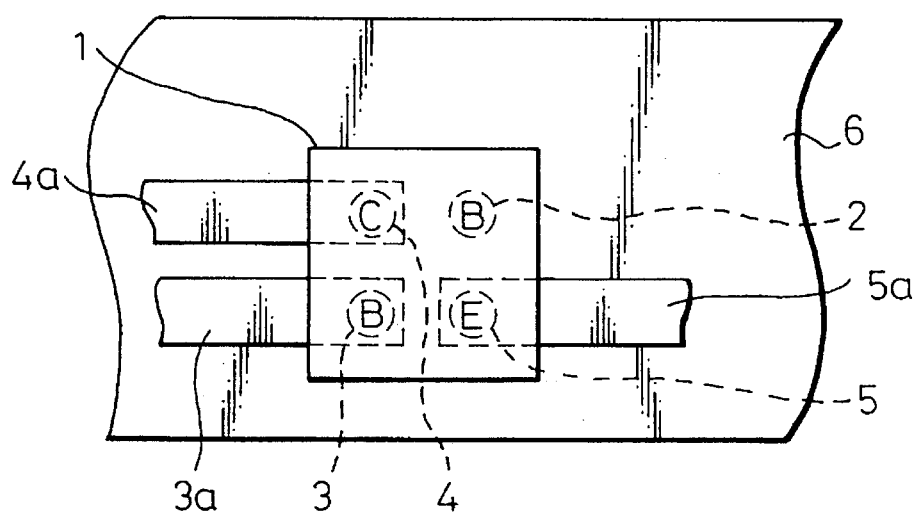
FIG. 2 is a diagram illustrating a state where the discrete transistor of the present invention is mounted and is wired.

FIG. 1 is a plan view showing the surface of a discrete transistor 1 in a flip-chip structure having four bumps, which is a semiconductor element of the present invention, and FIG. 2 is a diagram illustrating a state in which the four-bump discrete transistor 1 is mounted on a substrate 6 and is wired.

In FIG. 1, four bumps composed of solder or the like are formed on the surface of the discrete transistor 1 to serve as electrodes. Among them, two bumps are used as a pair of base electrodes 2 and 3 that are arranged on the discrete transistor 1 along a diagonal line thereof, and either one of the remaining two bumps is used as a collector electrode 4 and the other bump is used as an emitter electrode 5. In other words, the base electrode 2 and the base electrode 3 are set at desired positions, an electrode in a region S1 which is one of the two regions S1 and S2 divided by a straight line 11 passing through these base electrodes 2 and 3, is set as the collector electrode 4, and the electrode in the other region S2 is set as the emitter electrode 5. This facilitates the wiring to the base electrodes 2 and 3 from any direction relative to the end surfaces of the discrete transistor 1. That is, even when the wiring to the collector electrode 4 and to the emitter electrode 5, and the wiring to either the base electrode 2 or the base electrode 3, are connected from any direction with respect to the end surfaces of the discrete transistor 1, the wiring can be easily accomplished if the direction of mounting the discrete transistor 1 is suitably changed.

As shown in FIG. 2, the discrete transistor 1 having electrodes arranged as described above is mounted and secured on the substrate 6 by bonding or the like with the surface forming the electrodes as the mounting surface. Wiring 5a is connected to the emitter electrode 5 of the discrete transistor 1 that is mounted, wiring 4a is connected to the collector electrode 4, and wiring 3a is connected to the base electrode 3 in the same direction as the wiring 4a.

Figure 3:
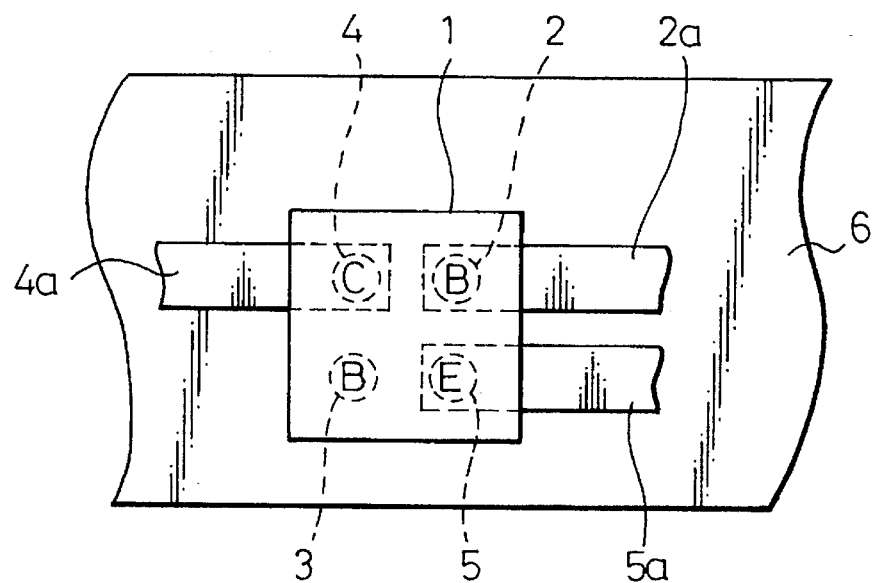
FIG. 3 is a diagram illustrating another state where the discrete transistor of the present invention is mounted and is wired.

FIG. 3 illustrates a wiring pattern different from that of FIG. 2 of the discrete transistor 1 having the same electrode arrangement as that of FIG. 1 (FIG. 2), and in which the wiring 4a is connected to the collector electrode 4, the wiring 5a is connected to the emitter electrode 5, and the wiring 2a is connected to the base electrode 2 in the same direction as the wiring 5a.

Here, if the wiring pattern of either FIG. 2 or FIG. 3 is selectively used as required, the wirings need not be drawn making an excess of detour, and there is no need to use the jumper or multi-layer wiring that sometimes had to be used depending upon the circuit constitution. According to the constitution of the present invention, therefore, there is no need to use an additional jumper or additional layers for forming a multi-layer wiring, and the production cost can be decreased correspondingly. Moreover, since the load upon the IC is equally divided into four, there is obtained a highly reliable semiconductor device without permitting the occurrence of loose contacts or leakage.

The two base electrodes 2 and 3 formed on the discrete transistor 1 can be used simultaneously. In this case, the pattern layout of the discrete transistor 1 must be suitably changed, which, however, can be carried out in the same manner as in the ordinary process for producing semiconductors and without any problem.

Figure 4:
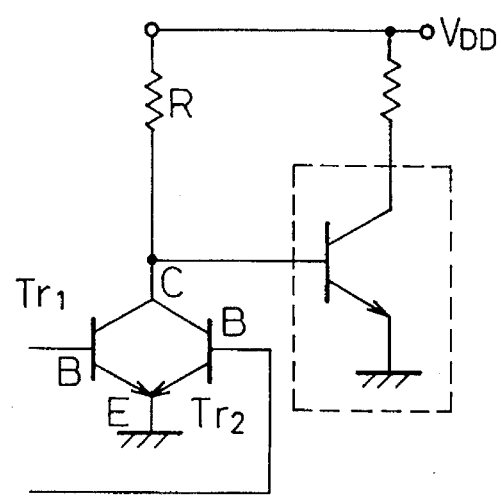
FIG. 4 is a diagram illustrating a NOR circuit to which the discrete transistor of the present invention is adapted.

FIG. 4 illustrates an example in which the two base electrodes 2 and 3 of the discrete transistor 1 are used simultaneously. FIG. 4 illustrates a NOR circuit in the form of an IC having at least a transistor 1 and a transistor 2, the transistors 1 and 2 being constituted in the form of a single discrete transistor (not shown). In this case, the collector electrode 4 of the discrete transistor 1 of FIG. 1 is connected to a resistor R, the emitter electrode 5 is connected to a ground terminal GND, the collector output of the transistor 1 is connected to the base electrode 2, and the collector output of the transistor 2 is connected to the base electrode 3. As described above, a portion that is made up of a single discrete transistor 1 could, so far, be constituted by using at least two discrete transistors 7 of a conventional constitution. Nowadays where densely mounted semiconductor devices of small sizes are required, use of the semiconductor element of this embodiment offers great advantage from the standpoint of reducing the size of the device as a whole.

Though the embodiment has dealt with the discrete transistor having four bumps, the same effects are also exhibited by a semiconductor element which has a plurality of electrodes in excess of four bumps provided the semiconductor element permits a circuit to be designed.

Figure 7A:
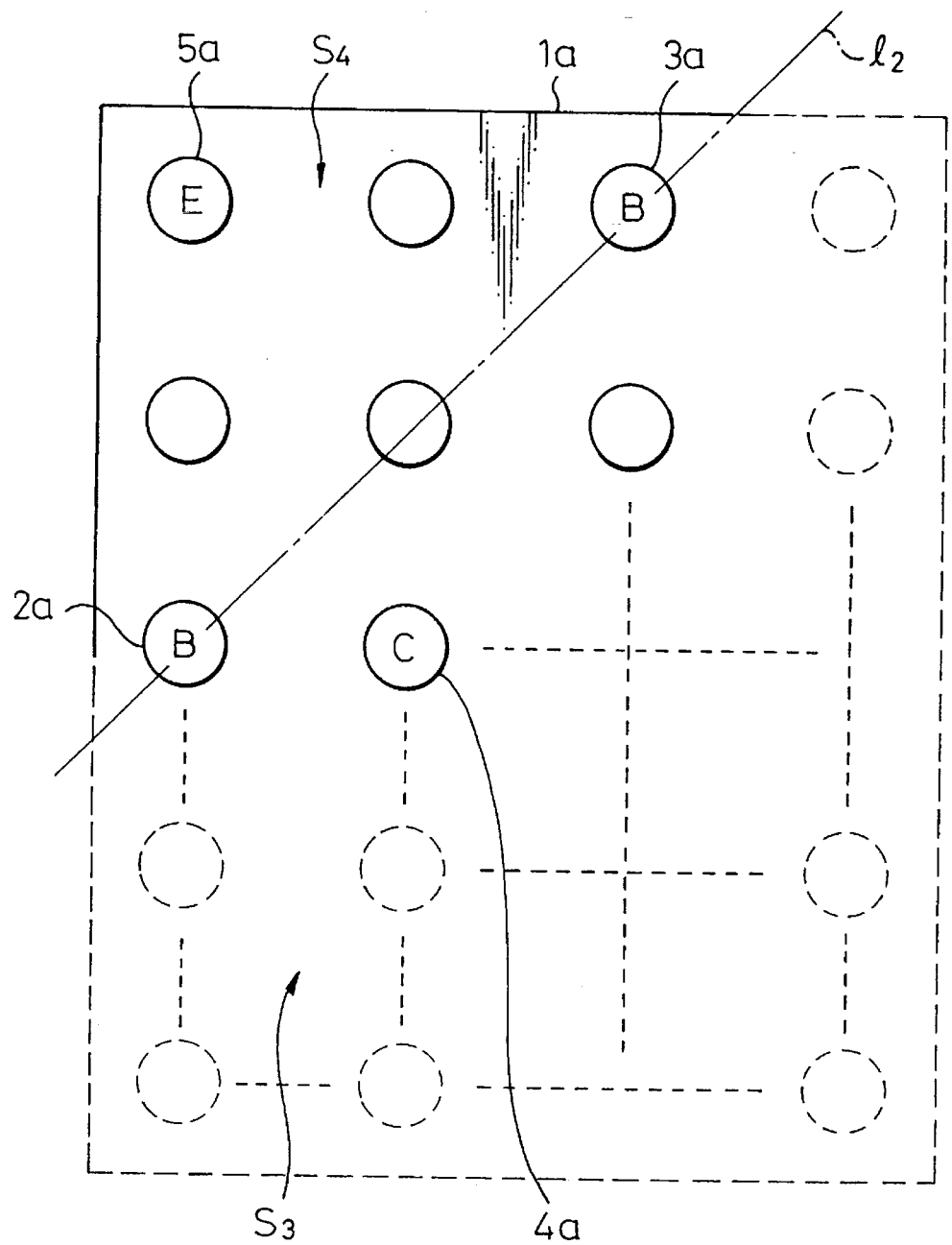
FIG. 7(a) is a plan view (No. 1) illustrating the arrangement of electrodes of a semiconductor element having a plurality of electrodes in excess of four bumps.

The above-mentioned semiconductor element is shown in FIG. 7(a). The plurality of electrodes in excess of four bumps can be arranged in a variety of ways. Considered below is the case where a base electrode is set at a position designated at 2a in FIG. 7(a) and another base electrode is set at a position designated at 3a.

That is, a collector electrode is formed by any electrode in a region S3 which is one of the two regions S3 and S4 divided by a straight line I2 passing through the base electrodes 2a and 3a, and an emitter electrode is formed by any electrode in the other region S4. In FIG. 7(a), the collector electrode is set at, for example, a position designated at 4a and the emitter electrode is set at a position designated at 5a.

Then, which of the other base electrode, emitter electrode or collector electrode is set at the remaining position, or whether any electrode is set at any position or not, may be suitably selected.

Figure 7B:
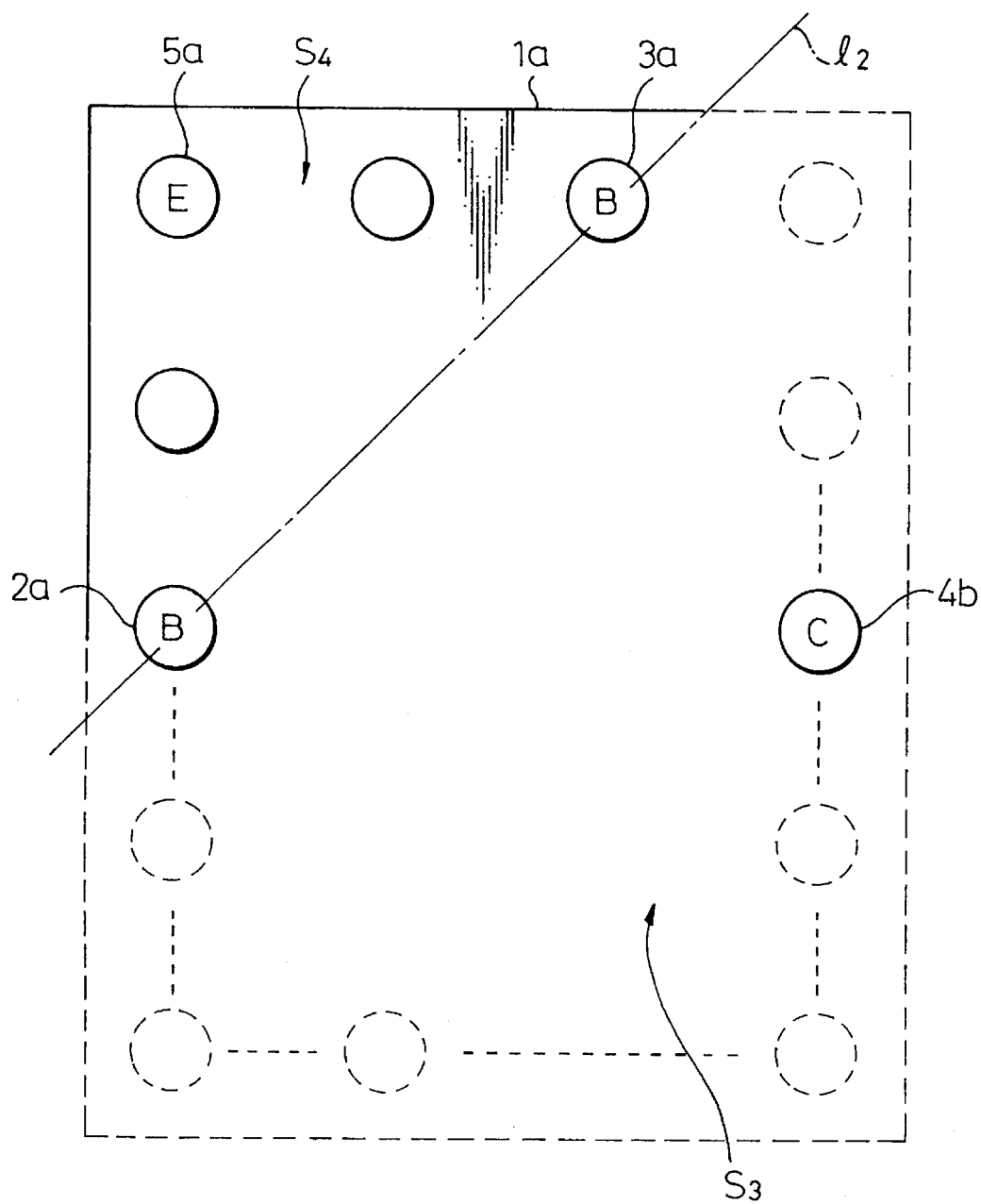
FIG. 7(b) is a plan view (No. 2) illustrating the arrangement of electrodes of a semiconductor element having a plurality of electrodes in excess of four bumps.

In the case of FIG. 7(a), however, the collector electrode 4a has not been set along the end surface of the semiconductor element. When wiring is to be connected from outside to the collector electrode 4a, therefore, care must be taken so that the wiring is not brought into contact with other electrodes, which is cumbersome. To avoid such care, it is recommended to use a semiconductor element having an electrode arrangement as shown in, for example, FIG. 7(b) and set, as the collector electrode 4b, any electrode along the outside of the semiconductor element in one region S3 divided by the straight line 12. This semiconductor element, however, need not be employed if the electrodes are set at the above-mentioned positions in the semiconductor element of FIG. 7(a), as a matter of course. For easy explanation, the arrangement of the electrodes other than the collector electrode in FIG. 7(b) is supposed to be the same as that of FIG. 7(a) and is denoted by the same symbols. However, no problem arises even when the electrodes are located in other positions.

Figure 5:
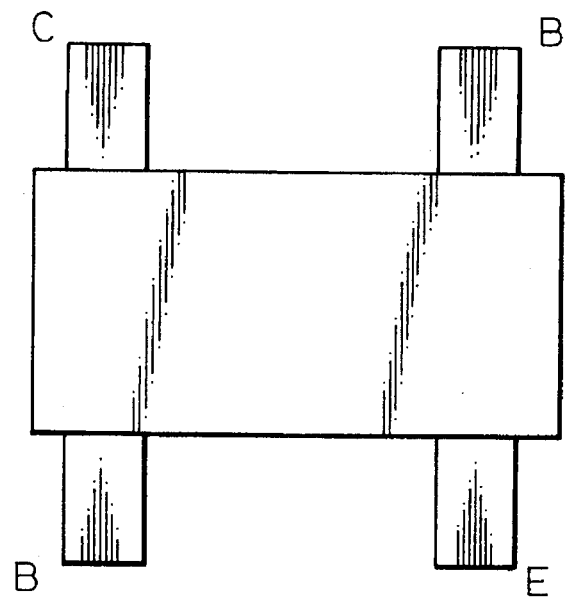
FIG. 5 is a plan view illustrating the arrangement of electrodes of an SOP of the present invention.

An SOP of a structure other than the flip chip structure of the above-mentioned embodiment can also be used as the surface-mounted semiconductor element to obtain the same effect. In a three-terminal SOP that is widely used, a terminal that serves as the base electrode may be added to accomplish the electrode arrangement as shown in FIG. 5.

Figure 6:
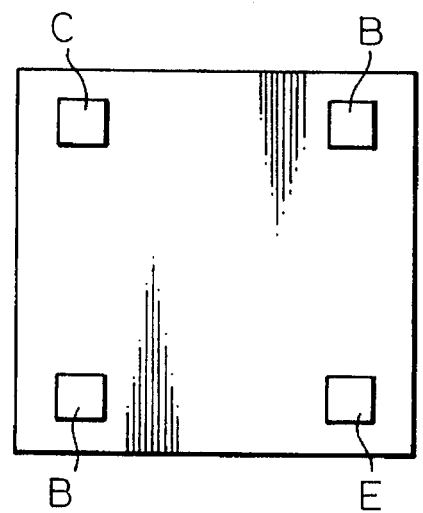
FIG. 6 is a plan view illustrating the arrangement of electrodes of a wire-bonded structure of the present invention.

Moreover, the same effects as those of the aforementioned embodiment can be obtained when the surface-mounted semiconductor element has a wire-bonding structure as shown in FIG. 6 or even when a DGS (drain-gate-source) electrode structure (not shown) of a MOSIC is allocated to the CBE (collector-base-emitter) electrode structure of a bipolar IC. In effect, in a semiconductor element having at least four or more electrodes mounted on a predetermined substrate, if the electrodes are arranged as in the above-mentioned embodiment, the wirings need not make a detour and the device as a whole can be realized in a small size.

According to the present invention as described above, base electrodes are provided on the same surface of the semiconductor element which is made up of a discrete transistor, and an emitter electrode and a collector electrode are provided neighboring the base electrodes in the up-and-down direction and in the right-and-left direction, respectively. Furthermore, another base electrode is provided on the same surface at a position different from the up-anddown direction or the right-and-left direction with respect to the above base electrode. By mounting the semiconductor element on the substrate, therefore, the wiring can be connected to the semiconductor element from any direction without using a jumper or multi-layer wiring.

Second Embodiment

This embodiment deals with an example to which the wire-bonding structure shown in FIG. 6 is adapted.

Figure 8:
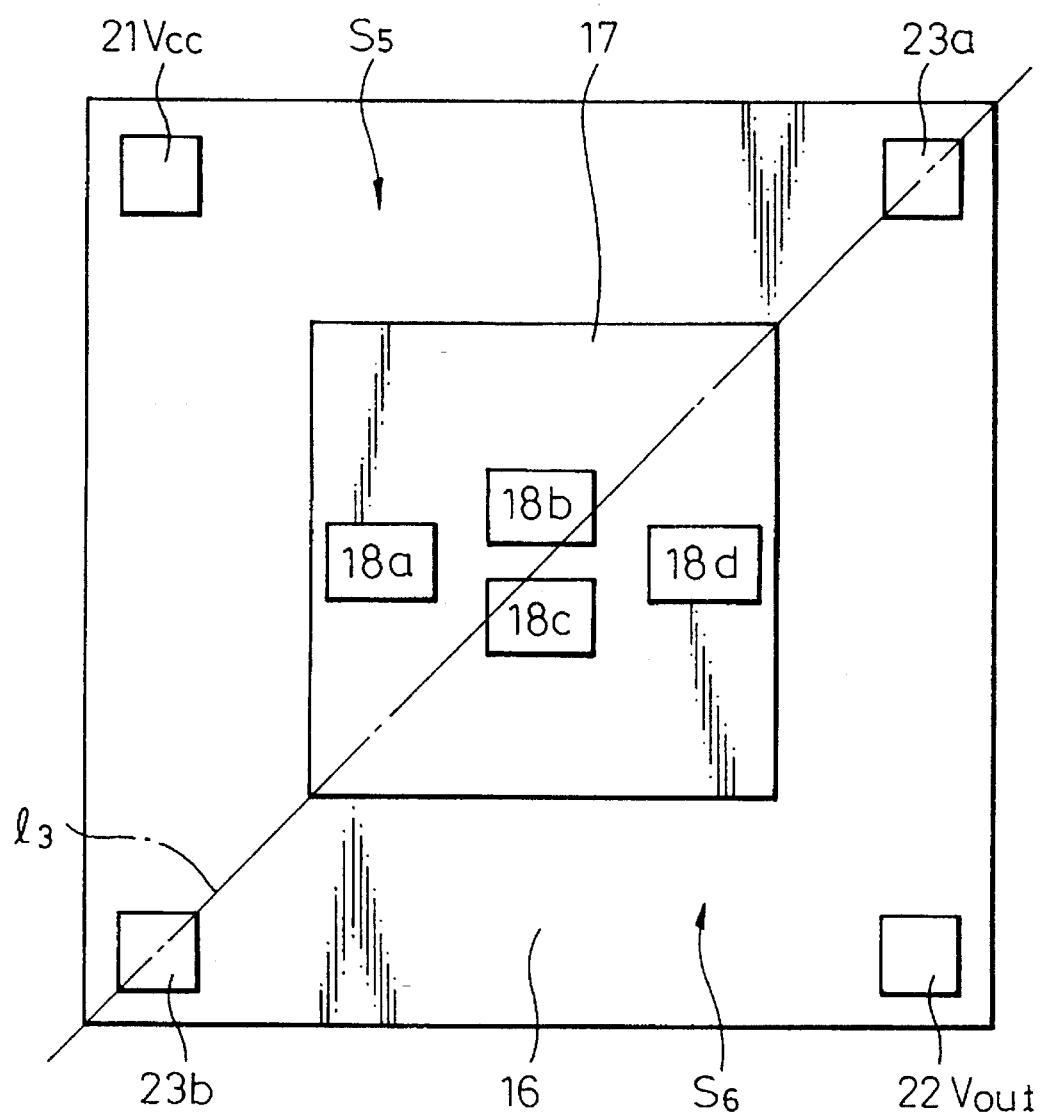
FIG. 8 is a plan view illustrating the arrangement of electrodes of when the semiconductor device of the present invention is adapted to a semiconductor pressure sensor chip.
Figure 9:
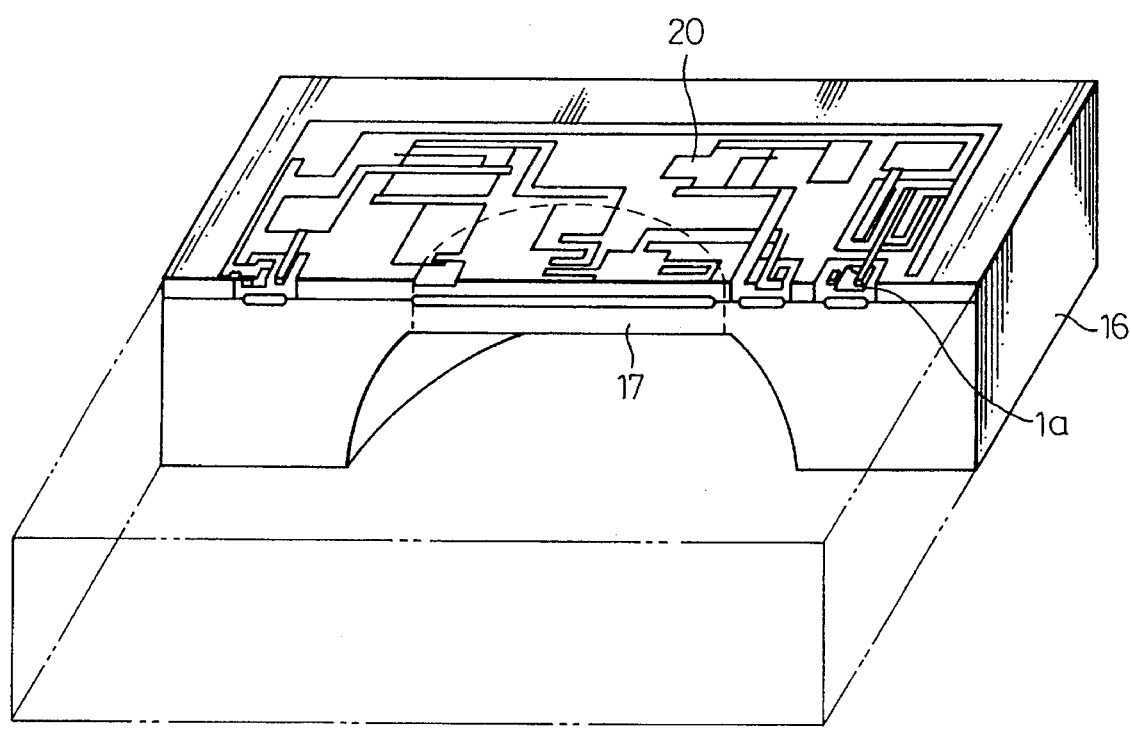
FIG. 9 is a diagram illustrating major portions of FIG. 8.

FIG. 8 illustrates the case where the semiconductor device of the present invention is a semiconductor pressure sensor chip, and FIG. 9 is a sectional view illustrating major portions thereof.

The semiconductor pressure sensor of this embodiment can be used for detecting the pressure, for example, in the intake manifold in a fuel injection control system of an automobile. In FIG. 8, a thin diaphragm 17 is formed at the central portion of a square silicon chip (semiconductor element) 16, the diaphragm 17 being formed in a square shape. On the diaphragm 17 are arranged four piezo-resistance layers 18a, 18b, 18c and 18d formed by diffusing impurities, and a bridge circuit is formed by the piezo-resistance layers 18a, 18b, 18c and 18d.

In the thick portions, other than the diaphragm 17, are formed, as shown in FIG. 9, a signal processing circuit 19 for amplifying or processing signals output from the bridge circuit, and a thin-film resistor 20 for adjustment, in an integrated form.

These circuit constitutions are the same as those of the prior art disclosed in, for example, Japanese Patent Publication (Kokoku) No. 62-55629 and are not described here since they do not pertain to the gist of the present invention.

In this embodiment, an electrode 21 (hereinafter referred to as Vcc pad) for feeding electric power to the silicon chip 16, an electrode 22 for outputting signals (hereinafter referred to as Vout pad), and first and second grounding electrodes 23a and 23b (hereinafter referred to as GND pads) are arranged in a manner as shown in FIG. 8. That is, on the same surface of the silicon chip 16, the first GND pad is provided at a position 23a, the second GND pad is provided at a position 23b, the Vcc pad 21 is provided in a region S5 which is one of the two regions S5 and S6 divided by a straight line 13 that passes through the first and second GND pads, and the Vout pad 22 is provided in the other region S6. In other words, one Vcc pad 21 and one Vout pad 22 are provided between the GND pads 23a and 23b.

Figure 10:
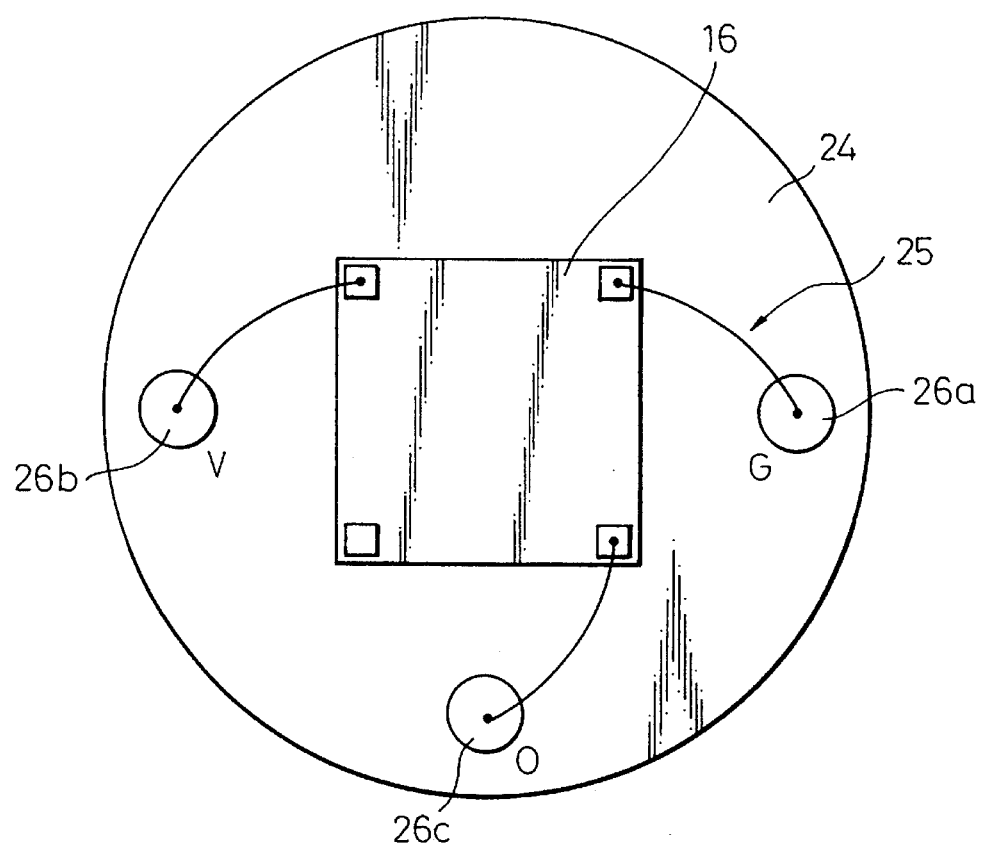
FIG. 10 is a diagram illustrating wiring to the electrodes in the semiconductor pressure sensor chip of FIG. 8.
Figure 11:
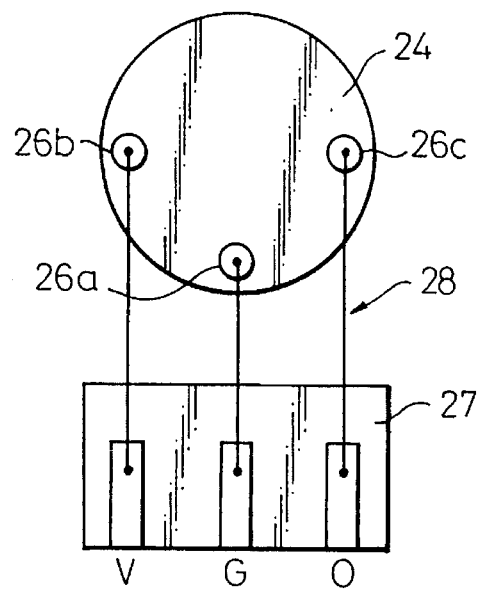
FIG. 11 is a diagram which schematically illustrates a state where the wirings of FIG. 10 are connected to a casing.

The thus constituted semiconductor pressure sensor chip is secured onto a stem 24 as shown in FIG. 10 with the surface which is opposite to the surface on which the electrode pads are arranged as the junction surface. The GND pad 23a, Vcc pad 21 and Vout pad 22 are bonded to electric connection terminals 26a, 26b and 26c provided on the stem 24 through wires 25 made of aluminum or gold and are electrically connected thereto. The electric connection terminals 26a, 26b and 26c are connected to predetermined terminal arrangements on a casing 27 (connector) via leads 28. In FIG. 11, the electric connection terminal 26a is connected to a terminal arrangement G of the casing 27, the electric connection terminal 26b is connected to a terminal arrangement V of the casing 27, and the electric connection terminal 26c is connected to a terminal arrangement 0 of the casing 27. The semiconductor pressure sensor of this embodiment is secured to a portion upon which the mechanical energy (pressure to be detected in this embodiment) acts, and the casing 27 is fitted to a predetermined portion (not shown) of the vehicle, such that a detection signal processed based on the pressure to be detected is sent to an external unit.

The terminals of the casing 27 used here are arranged on the surface of the paper in the order of V, G and 0 from the left as shown in FIG. 11. Usually, however, the casing that is used has terminals that are arranged in the order of V, 0 and G, which are different from the above arrangements. This casing is the same as the above-mentioned casing 27 but simply has different terminal arrangements.

Figure 12:
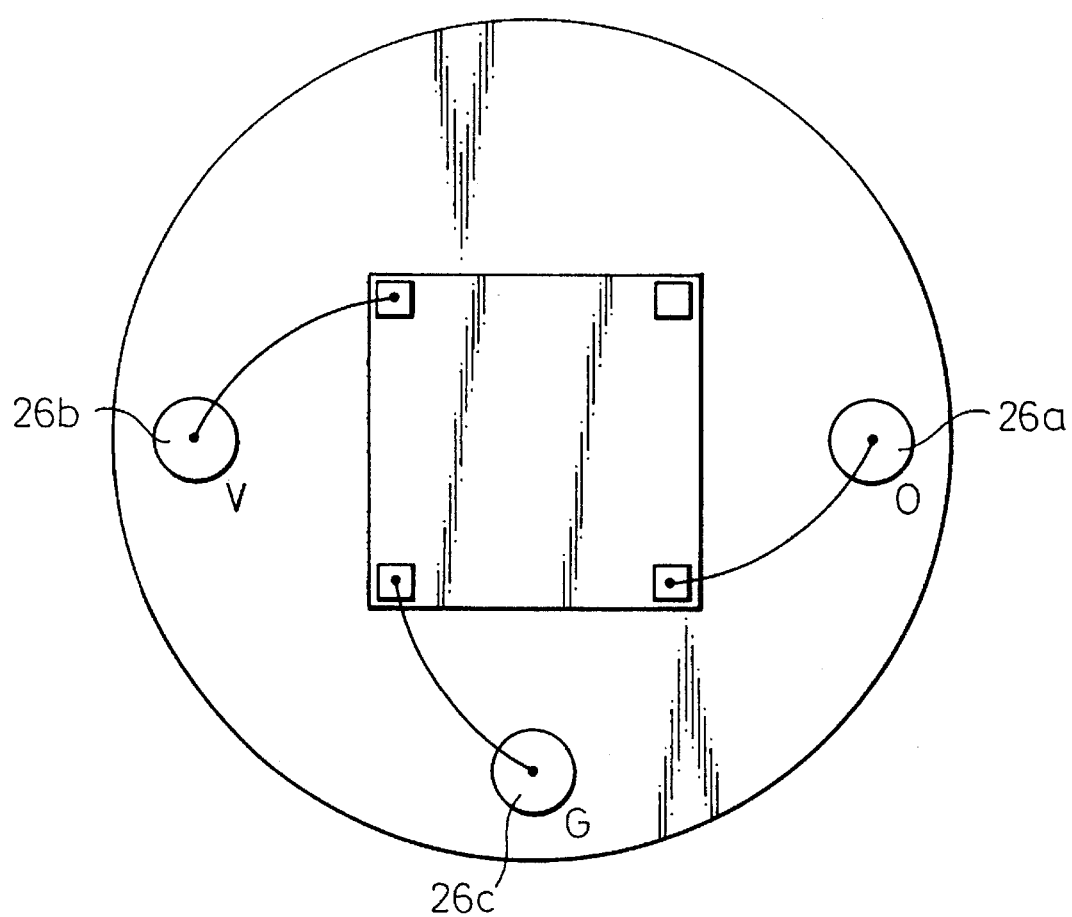
FIG. 12 is a diagram illustrating a state of using another GND pad on the semiconductor pressure sensor chip of FIG. 8.

In this instance as shown in FIG. 12, the GND pad 23b should be used instead of the GND pad 23a arranged on the silicon chip 16. That is, the GND pad 23b, Vcc pad 21 and Vout pad 22 are electrically connected to the electric connection terminals 26c, 26b and 26a via wires to easily meet the casing that has terminal arrangements of V, 0 and G. This makes it possible to meet the casings 27 having two kinds of terminal arrangements, eliminating the need of using different casings, two kinds of stems 24, two kinds of leads 28, or two kinds of silicon chips 16 and without inviting complexity that stems from an increase in the number of parts. Constitution can further be contrived in which the wires 25 are cross-connected without increasing the number of parts, which, however, is not practicable from the standpoint of production.

The above-mentioned embodiment has dealt with the instance where the invention was adapted to the casings having two kinds of terminal arrangements. However, it need not be pointed out that the semiconductor pressure sensor chip of this embodiment can be adapted to the other kinds of terminal arrangements, as a matter of course.

In the second embodiment of the present invention as described above, the two grounding electrodes are set at desired positions on the same surface of the semiconductor element, and the electrode in one region of the two regions divided by a straight line passing through the two grounding electrodes is set as an electrode for feeding electric power and the electrode in the other region is set as an electrode for outputting signals, to obtain the same effects as those of the aforementioned first embodiment.

In the semiconductor pressure sensor chip of the second embodiment, no problem arises even when the electrodes are constituted as shown in FIG. 7(a) or 7(b).

Figure 13:
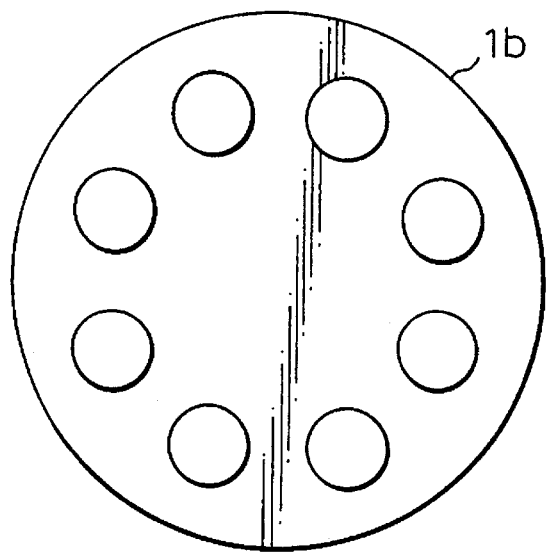
FIG. 13 is a diagram illustrating a modified example of the semiconductor element of another shape having a plurality of electrodes.
Figure 14:
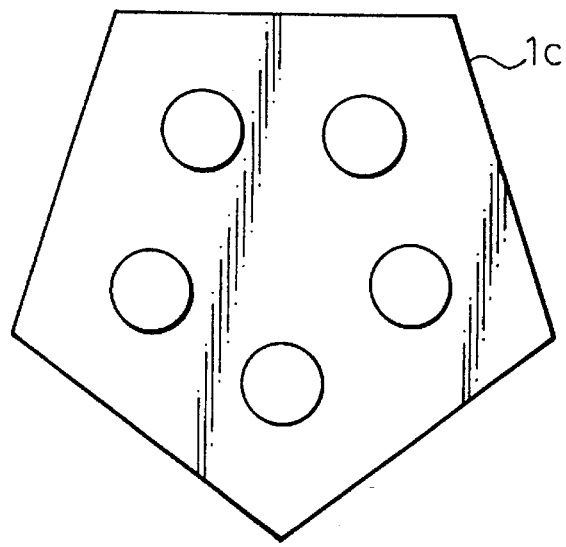
FIG. 14 is a diagram illustrating a modified example of the semiconductor element of a further shape having a plurality of electrodes.
Figure 15:
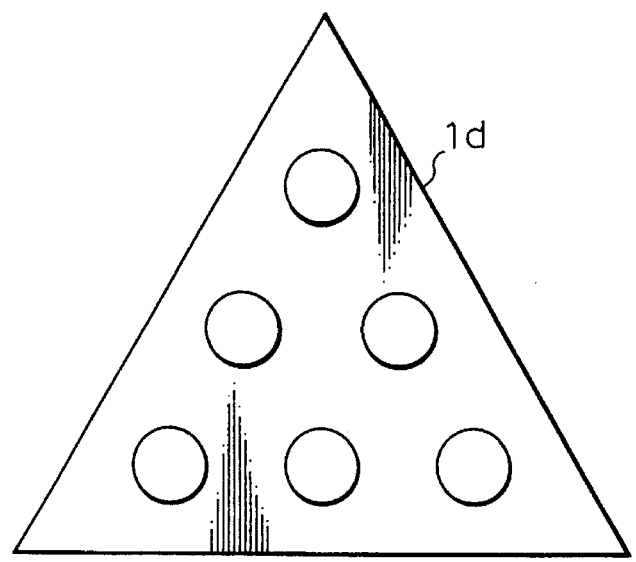
FIG. 15 is a diagram illustrating a modified example of the semiconductor element of a still further shape having a plurality of electrodes.
Figure 16:
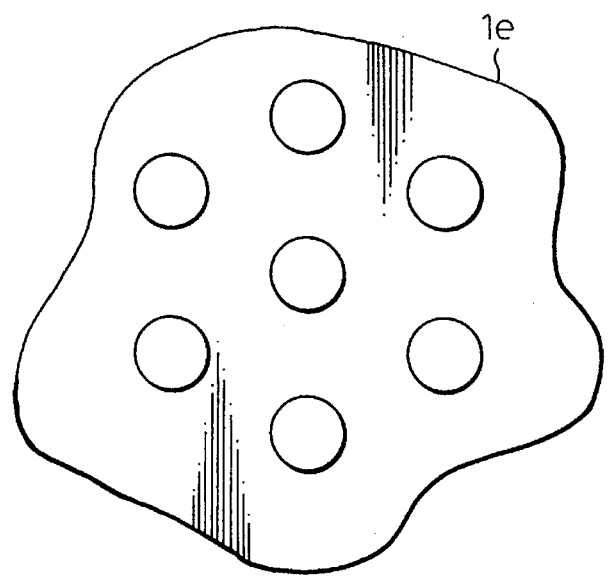
FIG. 16 is a diagram illustrating a modified example of the semiconductor element of a yet further shape having a plurality of electrodes.
Figure 17:
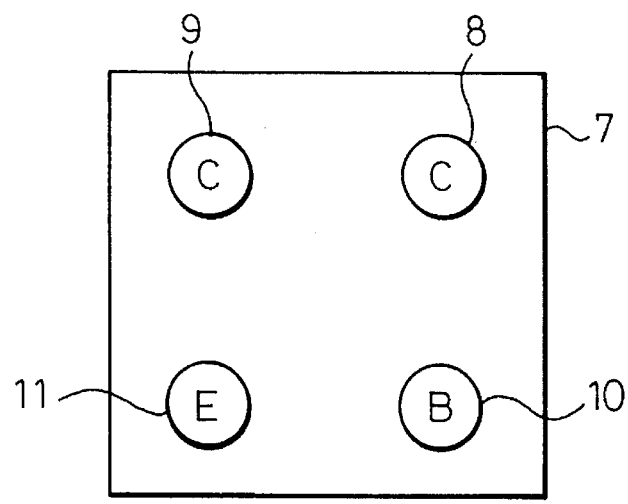
FIG. 17 is a plan view illustrating the arrangement of electrodes of a conventional discrete transistor.
Figure 18:
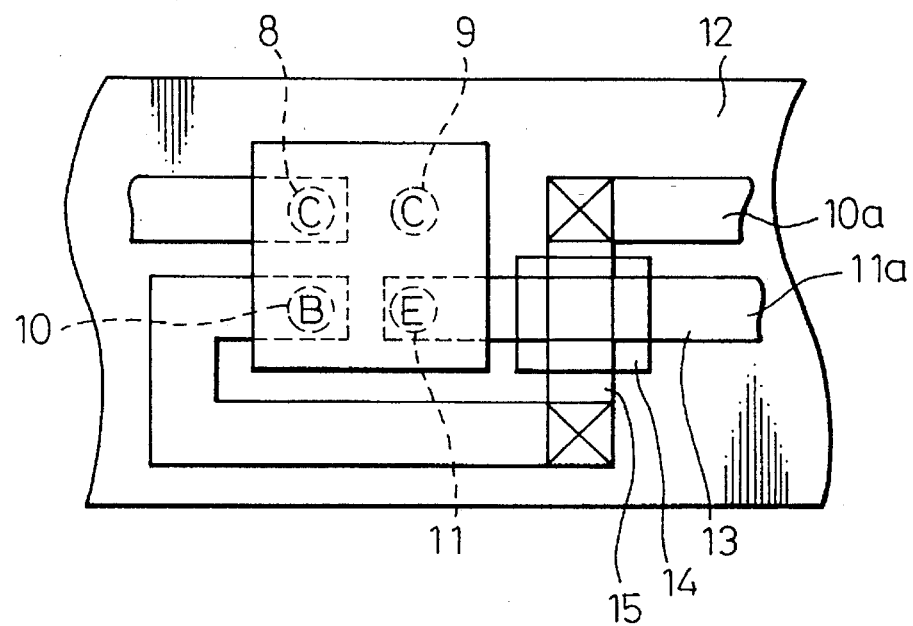
FIG. 18 is a diagram illustrating a state where the conventional discrete transistor is mounted and is wired.

Although the present invention has been described above in detail, it should be noted that the invention is in no way limited to these embodiments but can be modified in a variety of other ways without departing from the scope of the invention. The present invention can be sufficiently adapted to semiconductor elements of a variety of shapes such as a semiconductor element 1b shown in FIG. 13, a semiconductor element 1c shown in FIG. 14, a semiconductor element 1d shown in FIG. 15 and a semiconductor element 1e shown in FIG. 16. In these cases, there should exist at least four or more electrodes on the same surface of the semiconductor element and there should exist at least one electrode in each of the two regions that are divided by a straight line that passes through two electrodes of the same kind which are set at desired positions and are selectively used, the electrodes in these two regions being the ones of different kinds.

In the present invention, a semiconductor device comprises a semiconductor element which has a plurality of electrodes formed on the same surface thereof and in which a plurality of wiring members are connected from the external side to the electrodes of the semiconductor element; wherein, (1) two electrodes are set as first electrodes at desired positions;

(2) an electrode in one of the two regions divided by a straight line passing through the two first electrodes is set as either a second electrode or a third electrode;

(3) an electrode in the other one of the two regions divided by the straight line passing through the two first electrodes is set as the other electrode relative to the electrode set in (2) above; and (4) the first, second and third electrodes are of different kinds, a first wiring member is selectively connected to either one of the two first electrodes, a second wiring member is connected to the second electrode and a third wiring member is connected to the third electrode.

It is desired that the first, second and third electrodes are set at least along the end surfaces of the semiconductor element.

It is further desired that the semiconductor element is secured on a substrate, and the wiring members consist of conductors formed on the surface of the substrate.

It is desired that after the first, second and third electrode are set, a remaining electrode is set as an arbitrary electrode.

It is desired that the wiring members consist of wires.

It is desired that the semiconductor element comprises a discrete transistor of which the surface on which the electrodes are formed serves as the mounting surface, the base electrode of the discrete transistor corresponding to the first electrodes, and the emitter electrode and the collector electrode thereof corresponding to either the second electrode or the third electrode, respectively.

Furthermore, the semiconductor element comprises a MOS transistor, the gate electrode of the MOS transistor corresponding to the first electrode, and the source electrode and the drain electrode thereof each corresponding to either the second electrode or the third electrode.

It is further allowable that the semiconductor element is one which is so constituted as to output a signal in response to the action of mechanical energy from the external side, and the electrodes include at least an electrode for feeding electric power, an electrode for outputting signals and a plurality of electrodes for grounding, the electrodes for grounding corresponding to the first electrodes, and the electrode for feeding electric power and the electrode for outputting signals corresponding to either the second electrode or the third electrode.

In this case, the electrodes will be connected through wires to transmit and receive electric signals.

In any one of the above-mentioned constitutions, the wirings can be connected to the semiconductor element from any direction.

We claim:

1. A semiconductor device, comprising:

a semiconductor element having a plurality of electrodes formed on one surface; and a plurality of wiring members connected to the electrodes;

said electrodes including at least two first electrodes, and a second electrode and a third electrode of different kinds which are separated from said first electrodes, a first of said plurality of wiring members being selectively connected to at least one and less than all of said two first electrodes, and a second and a third of said plurality of wiring members being connected to said second and third electrodes, respectively; and said two first electrodes, said second electrode and said third electrode being arranged on the surface of said semiconductor element such that a straight line passing through said two first electrodes separates said semiconductor element into two regions, said second electrode being contained in a first of said two regions and said third electrode being contained in a second of said two regions.

2. A semiconductor device as set forth in claim 1, wherein said first, second and third electrodes are set along end surfaces of said semiconductor element.

3. A semiconductor device as set forth in claim 1, wherein said semiconductor element is secured on a substrate, and said wiring members comprise conductors formed on the surface of said substrate.

4. A semiconductor device as set forth in claim 1, further comprising a fourth electrode.

5. A semiconductor device as set forth in claim 1, wherein said wiring members comprise wires.

6. A semiconductor device as set forth in claim 1, wherein said semiconductor element comprises a discrete transistor, the surface on which the electrodes are formed serving as the mounting surface, the base electrode of the discrete transistor corresponding to said first electrodes, and the emitter electrode and the collector electrode thereof corresponding to said second electrode and said third electrode, respectively.

7. A semiconductor device as set forth in claim 1, wherein said semiconductor element comprises a MOS transistor, the gate electrode of the MOS transistor corresponding to said first electrodes, and the source electrode and the drain electrode thereof corresponding to said second electrode and said third electrode, respectively.

8. A semiconductor device as set forth in claim 1, wherein said semiconductor element outputs a signal in response to the action of physical energy from outside, and said electrodes include at least an electrode for feeding electric power, an electrode for outputting signals and a plurality of ground electrodes, the ground electrodes corresponding to said first electrodes, and the electrode for feeding electric power and the electrode for outputting signals corresponding to said second electrode and said third electrode, respectively.

9. A semiconductor device as set forth in claim 8, wherein at least one of said first electrodes, said second and said third electrodes are connected by wires to transmit and receive electrical signals.

10. A semiconductor device, comprising:

a substrate having a plurality of wiring members;

a semiconductor element disposed on said substrate and having a plurality of electrodes formed on one surface, said plurality of electrodes being connected to said plurality of wiring members;

said electrodes including at least two first electrodes, and a second electrode and a third electrode of different kinds which are separate from said first electrodes, a first of said plurality of wiring members being selectively connected to at least one and less than all of said first electrodes, and a second and a third of said wiring members being connected to said second and third electrodes, respectively; and said electrodes on the surface of said semiconductor element being arranged such that a straight line passing through said two first electrodes separates said surface of said semiconductor element into two regions, said second electrode being contained in a first of said two regions and said third electrode being contained in a second of said two regions.

11. A semiconductor device as set forth in claim 10, wherein said first, second and third electrodes are set along end surfaces of said semiconductor element.

12. A semiconductor device as set forth in claim 10, wherein said wiring members comprise conductors formed on the surface of said substrate.

13. A semiconductor device as set forth in claim 10, wherein said wiring members comprise wires.

14. A semiconductor device as set forth in claim 10, wherein said semiconductor element comprises a MOS transistor, the gate electrode of the MOS transistor corresponding to said first electrodes, and the source electrode and the drain electrode thereof corresponding to said second electrode and said third electrode, respectively.

15. A semiconductor device as set forth in claim 10, wherein said semiconductor element is capable of outputting a signal in response to the action of mechanical energy from outside, and said electrodes include at least an electrode for feeding electric power, an electrode for outputting signals and a plurality of ground electrodes, the ground electrodes corresponding to said first electrodes, and the electrode for feeding electric power and the electrode for outputting signals corresponding to said second electrode and said third electrode, respectively.

16. A semiconductor device as set forth in claim 10, wherein said semiconductor element outputs a signal in response to the action of physical energy from the external side, and said electrodes include at least an electrode for feeding electric power, an electrode for outputting signals and a plurality of ground electrodes, the ground electrodes corresponding to said first electrodes, and the electrode for feeding electric power and the electrode for outputting signals corresponding to said second electrode and said third electrode, respectively.

17. A semiconductor device as set forth in claim 10, wherein at least one of said first electrodes, said second and said third electrodes are connected by wires to transmit and receive electrical signals.

* * * * *